US010946577B2

(12) United States Patent
Yu et al.

(10) Patent No.: US 10,946,577 B2
(45) Date of Patent: Mar. 16, 2021

(54) IMPRINTING APPARATUS

(71) Applicant: SAMSUNG ELECTRONICS CO., LTD., Suwon-si (KR)

(72) Inventors: Ho Yu, Pohang-si (KR); Byeong Sang Kim, Hwaseong-si (KR); Jung Wook Kim, Seongnam-si (KR); Kyung Bin Park, Seoul (KR); Ki Ju Sohn, Gunpo-si (KR); Eun Soo Hwang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 273 days.

(21) Appl. No.: 15/946,790

(22) Filed: Apr. 6, 2018

(65) Prior Publication Data

US 2019/0099938 A1    Apr. 4, 2019

(30) Foreign Application Priority Data

Oct. 2, 2017  (KR) .................. 10-2017-0128512

(51) Int. Cl.
*B29C 59/04*  (2006.01)
*B41L 47/46*  (2006.01)
*G03F 7/00*  (2006.01)

(52) U.S. Cl.
CPC .............. *B29C 59/04* (2013.01); *B41L 47/46* (2013.01); *G03F 7/0002* (2013.01)

(58) Field of Classification Search
CPC ......... G03F 7/0002; B29C 59/04; B41L 47/46
See application file for complete search history.

(56) References Cited

U.S. PATENT DOCUMENTS

| 4,384,518 | A | * | 5/1983 | Albin | ............... B41F 17/22 101/350.5 |
| 4,487,050 | A | * | 12/1984 | Kajiwara | ........... B21B 13/147 72/241.8 |
| 4,601,239 | A | * | 7/1986 | Sillars | ................. B41F 17/00 101/142 |
| 5,527,497 | A | * | 6/1996 | Kanome | ............. B29C 43/222 264/1.33 |
| 5,639,339 | A | * | 6/1997 | Couillard | .......... B32B 37/0053 156/555 |
| 6,372,608 | B1 | | 4/2002 | Shimoda et al. | |

(Continued)

FOREIGN PATENT DOCUMENTS

| JP | 2014-054735 A | 3/2014 |
| KR | 10-1061183 B1 | 8/2011 |

(Continued)

*Primary Examiner* — David H Banh
(74) *Attorney, Agent, or Firm* — Lee IP Law, P.C.

(57) ABSTRACT

An imprinting apparatus includes a first frame, a pressure roller rotatably supported on a first end of the first frame, a second frame including a support portion coupled to a second end of the first frame, and at least one guide portion coupled to the support portion to be laterally movable, and at least one load roller supported by the at least one guide portion, the at least one load roller being movable in a vertical direction while being rotatable and contacting a surface of the pressure roller on an upper portion of the pressure roller according to a lateral movement of the guide portion, the at least one load roller to press the pressure roller by force exerted by a load of the at least one load roller.

17 Claims, 8 Drawing Sheets

(56) References Cited

U.S. PATENT DOCUMENTS

| | | |
|---|---|---|
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,029,717 B2 * | 10/2011 | Nakamura ............ B29C 43/021 118/232 |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2007/0204953 A1 | 9/2007 | Lin |
| 2007/0281239 A1* | 12/2007 | Uematsu ............... G03G 5/043 430/133 |
| 2008/0028958 A1* | 2/2008 | Park ...................... B29C 43/222 101/212 |
| 2011/0005412 A1* | 1/2011 | Fujii ...................... B29C 59/04 101/216 |
| 2014/0174306 A1* | 6/2014 | Wening ................ B32B 37/203 101/25 |
| 2014/0252679 A1 | 9/2014 | Hwang et al. |
| 2014/0346713 A1 | 11/2014 | Wada |
| 2015/0217506 A1* | 8/2015 | Kawaguchi ............ B29C 59/04 264/293 |
| 2015/0283754 A1* | 10/2015 | Kawaguchi ............ B29C 59/02 264/496 |
| 2017/0072620 A1* | 3/2017 | Kawaguchi ........... B29C 59/002 |

FOREIGN PATENT DOCUMENTS

| | | | |
|---|---|---|---|
| KR | 10-1062128 B1 | 8/2011 | |
| WO | WO 2015/186736 | * 10/2015 | ........... B29C 59/002 |

* cited by examiner

IMPRINTING APPARATUS

CROSS-REFERENCE TO RELATED APPLICATION

Korean Patent Application No. 10-2017-0128512, filed on Oct. 2, 2017, in the Korean Intellectual Property Office, and entitled: "Imprinting Apparatus," is incorporated by reference herein in its entirety.

BACKGROUND

1. Field

The present disclosure relates to an imprinting apparatus.

2. Description of the Related Art

As the size of display devices is increased, it has become important for large-area fine patterns on substrates to have uniform quality. A nanoimprint lithography method is used in a process of forming such large-area fine patterns. In the nanoimprint lithography method, after a photocurable resin is coated on a substrate, ultraviolet light is irradiated thereonto, while a stamp having a concavo-convex pattern corresponding to a fine pattern is pressed on the photocurable resin to cure the photocurable resin. Then, the stamp is separated therefrom to form fine patterns.

SUMMARY

According to an aspect of the present disclosure, an imprinting apparatus includes a first frame, a pressure roller rotatably supported on a first end of the first frame, a second frame including a support portion coupled to a second end of the first frame, and at least one guide portion coupled to the support portion to be laterally movable, and at least one load roller supported by the at least one guide portion, the at least one load roller being movable in a vertical direction while being rotatable and contacting a surface of the pressure roller on an upper portion of the pressure roller according to a lateral movement of the guide portion, the at least one load roller to press the pressure roller by force exerted by a load of the at least one load roller.

According to an aspect of the present disclosure, an imprinting apparatus includes a first frame disposed above an imprint mold, to move in a single direction along the imprint mold, a pressure roller rotatably supported on the first frame to press the imprint mold as the first frame moves, a second frame coupled to the first frame, to be laterally movable, and at least one load roller rotatably supported by the second frame while contacting the pressure roller on an upper portion of the pressure roller to press the pressure roller by force exerted by a load of the at least one load roller, having a central shaft disposed to deviate from a central shaft of the pressure roller in a direction perpendicular to the single direction, and moving while being in contact with a surface of the pressure roller according to a lateral movement of the second frame.

According to an aspect of the present disclosure, an imprinting apparatus includes a first frame disposed above an imprint mold, to move in a single direction along the imprint mold, a pressure roller rotatably supported on the first frame to press the imprint mold as the first frame moves, a second frame including a support portion coupled to the first frame, and at least one guide portion coupled to the support portion, to be laterally movable in the single direction on the support portion, a driving unit disposed on the support portion, to laterally move the guide portion in the single direction, a controller controlling the driving unit, and at least one load roller rotatably supported on the guide portion while contacting the pressure roller on an upper portion of the pressure roller to press the pressure roller by force exerted by a load of the at least one load roller, and changing pressing force applied to the imprint mold by the pressure roller, while moving along a surface of the pressure roller as the guide portion is moved laterally in response to a driving signal of the controller.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Hereinafter, various embodiments of the present disclosure will be described with reference to the accompanying drawings.

Figure 1:
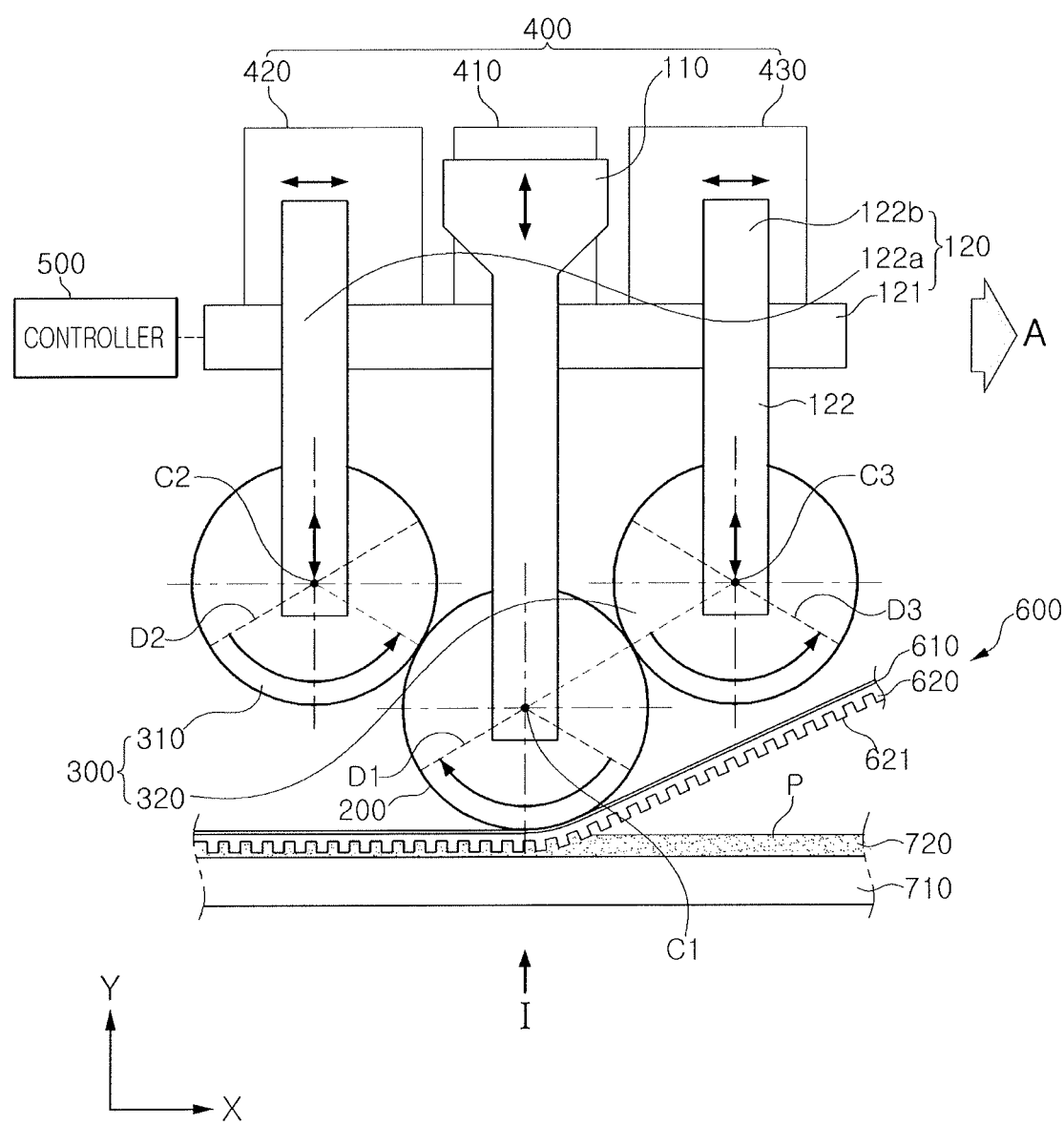
FIG. 1 illustrates a schematic cross-sectional view of an imprinting apparatus according to an example embodiment of the present disclosure.
Figure 2:
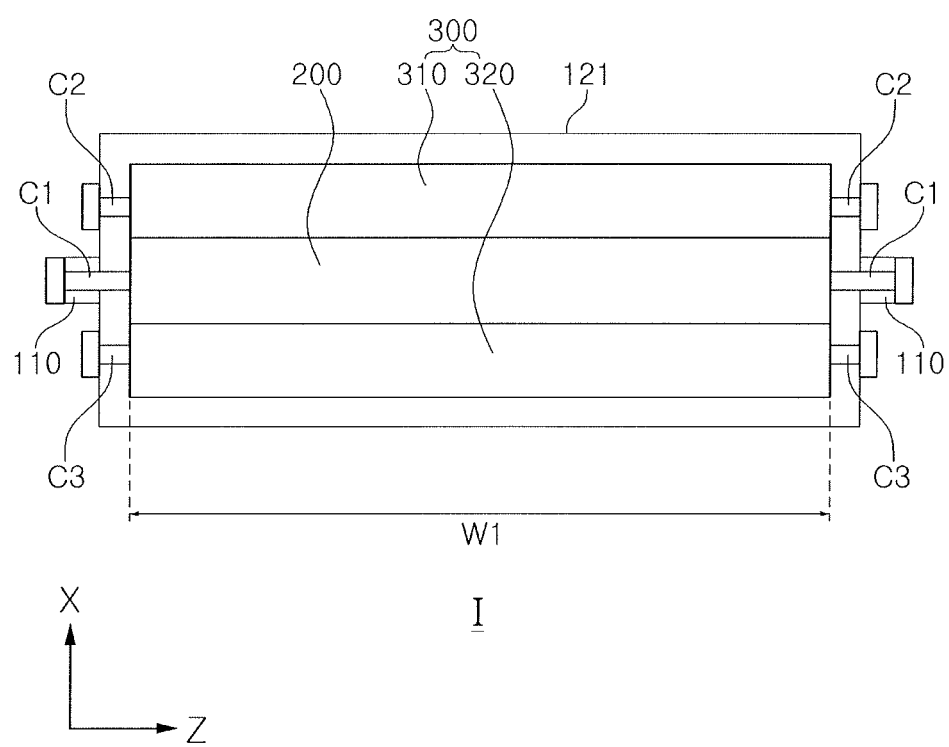
FIG. 2 illustrates a plan view of the imprinting apparatus of FIG. 1 when viewed in an 'I' direction.
Figure 3:
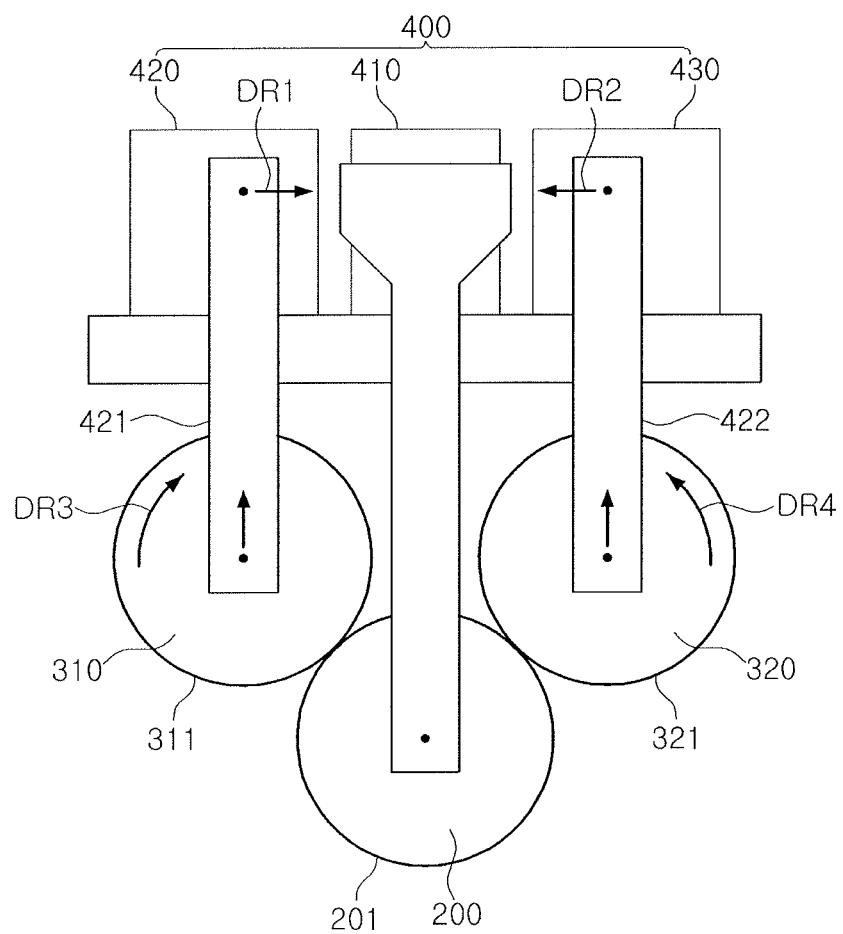
FIG. 3 illustrates a view of a variable pressing process by a load roller of the imprinting apparatus of FIG. 1.
Figure 4:
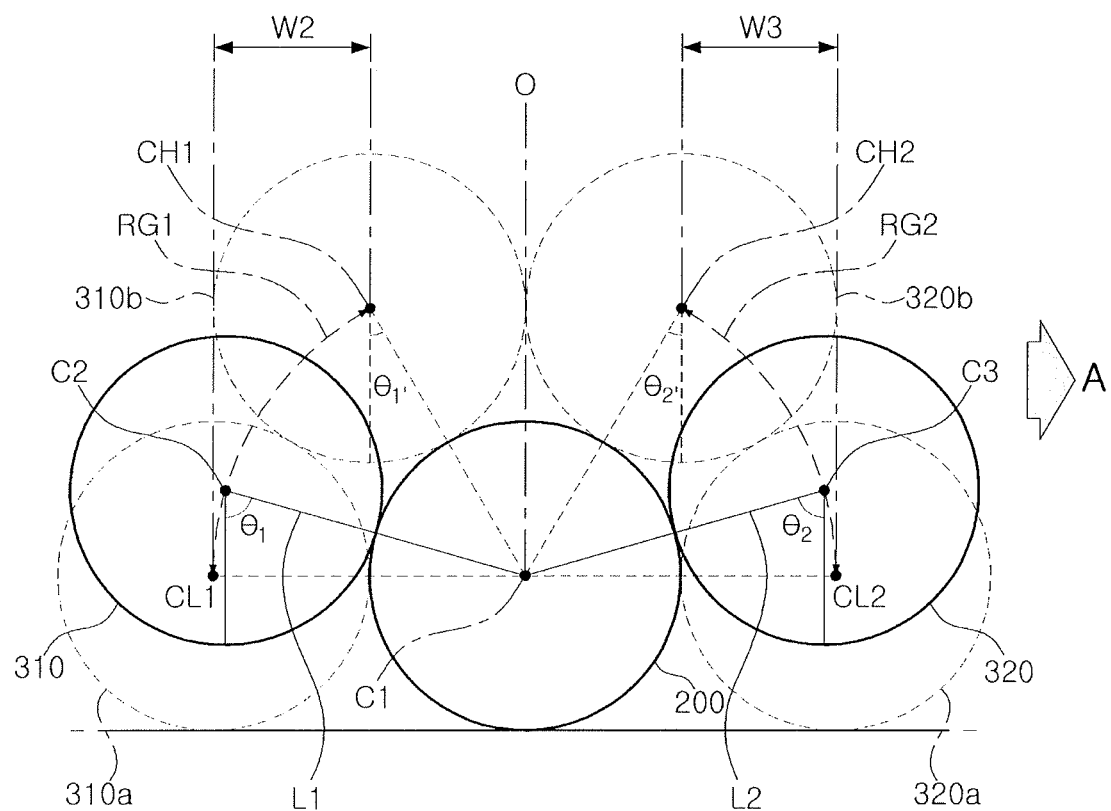
FIG. 4 illustrates a view of a variable width of the load roller of FIG. 3.

FIG. 1 is a schematic cross-sectional view of an imprinting apparatus according to an example embodiment, while FIG. 2 is a plan view of the imprinting apparatus of FIG. 1 when viewed in an 'I' direction (from the bottom of the imprinting apparatus). FIG. 3 is a view of a varying pressure pressing process of a load roller of the imprinting apparatus of FIG. 1, and FIG. 4 is a view of a variable width of the load roller of FIG. 3.

Referring to FIG. 1, in an imprinting apparatus 1 according to an example embodiment, an imprint mold 600 may be sequentially pressure-pressed from one side of a glass substrate 710 to another side thereof, to be attached thereto. When the glass substrate 710 is coated with an imprint material 720 on an upper surface thereof, a concavo-convex pattern 621 of the imprint mold 600 may be transferred to the imprint material 720 upon pressure-pressing of the imprint mold 600 with the concavo-convex pattern 621 onto the upper surface of the glass substrate 710 with the imprint material 720. In an example embodiment, the imprint mold 600 may be a flexible substrate formed by attaching a stamp 620 having the concavo-convex pattern 621 to an elastic tape 610, and the imprint material 720 may be an ink in which a photocurable resin is diluted in a diluted solution.

In detail, as illustrated in FIG. 1, the imprinting apparatus 1 may include a first frame 110, a second frame 120, a pressure roller 200, a load roller 300, a driving unit 400, and a controller 500 controlling the driving unit 400. The first frame 110 and the second frame 120 may be coupled to ends of the pressure roller 200 and the load roller 300, respectively. The first and second frames 110 and 120 with the corresponding pressure roller 200 and load roller 300 may be positioned above the glass substrate 710 and the imprint mold 600, so the pressure roller 200 may pressure-press the imprint mold 600 to the glass substrate 710.

In further detail, as illustrated in FIG. 1, the first frame 110 may be a structure supporting the pressure roller 200. The first frame 100 may be disposed above the imprint mold 600 to move in a single direction A. e.g., in a horizontal direction along the x-axis direction, along the imprint mold 600, and may be provided with the pressure roller 200 rotatably supported, e.g., coupled, on one side thereof. For example, referring to FIG. 1, the first frame 100 with the pressure roller 200 at the end thereof may move along the imprint mold 600 along the A direction, while the pressure roller 200 rotates and contacts the imprint mold 600, so the imprint mold 600 is pressed onto the glass substrate 710 while the first frame 100 with the pressure roller 200 moves thereabove.

The second frame 120 may be a structure supporting the load roller 300, and may be coupled to the first frame 110 to be movable in a vertical direction. The second frame 120 may include a support portion 121, e.g., a linear structure along the x-axis direction, coupled to the first frame 110 to be vertically movable, and to one or more guide portions 122a and 122b, e.g., linear structures along the y-axis direction, coupled to the support portion 121 to be movable in a horizontal direction along the support portion 121. For example, referring to FIG. 1, the support portion 121 may be moveable in the vertical direction, e.g., along the y-axis direction, to move the first frame 100 vertically, while the guide portions 122a and 122b may be at, e.g., opposite, ends of the support portion 121 to move horizontally along the support portion 121. In an example embodiment, a case in which the first guide portion 122a and the second guide portion 122b are included will be described below as an example. The first guide portion 122a and the second guide portion 122b may be disposed on both sides of the first frame 110 in parallel with each other.

The pressure roller 200 may be provided, in such a manner that a central shaft C1 thereof is rotatably supported on the first frame 110, e.g., the central shaft C1 of the pressure roller 200 may be rotatably attached to an end of the first frame 110. Thus, the pressure roller 200 may rotate while pressing the imprint mold 600 by a load thereof, as the first frame 110 moves. For example, while the first frame 110 moves in the direction A, the pressure roller 200 may rotate while pressing the imprint mold 600 by the load thereof. In addition, an upper portion of the pressure roller 200 may be disposed to be in contact with the load roller 300, to apply pressing force, provided by the load of the load roller 300, to the imprint mold 600. In other words, the load roller 300 contacting the pressure roller 200 may increase the pressing pressure applied to the imprint mold 600, as will be described in detail below.

As illustrated in FIG. 2, the pressure roller 200 may have an elongated cylindrical shape in the z-axis direction (into the page of FIG. 1), and the central shaft C1 disposed on both ends of the pressure roller 200 may be rotatably supported by the first frame 110. The pressure roller 200 may have a cylindrically-shaped body formed of a metal material having durability, e.g., stainless steel, and a surface of the cylindrical shaped body may be coated with an elastic material, e.g., rubber, to uniformly press a surface of the imprint mold 600. The pressure roller 200 may contact or may be separated from the imprint mold 600, as the first frame 110 is moved upwardly and downwardly by a pressure roller driver 410 to be described later.

Referring back to FIG. 1, the load roller 300 may apply additional pressing force, exerted by a load of the load roller 300, to the pressure roller 200. For example, the load roller 300 may include first and second load rollers 310 and 320 attached to the first and second guide portions 122a and 122b, respectively. Each of the first and second load rollers 310 and 320 may contact the pressure roller 200 to apply additional pressing force thereto. In detail, a central shaft C2 and a central shaft C3 of the first and second load rollers 310 and 320, respectively, may be supported on the first guide portion 122a and the second guide portion 122b, respectively. For example, the central shafts C2 and C3 of first and second load rollers 310 and 320 may be rotatably attached to respective ends of the first and second guide portions 122a and 122b, to be vertically movable and be rotatable.

As illustrated in FIG. 2, the load roller 300 may have an elongated cylindrical shape along the z-axis direction. i.e., similar to the shape of the pressure roller 200, and may only be formed of a metal material having durability, e.g., stainless steel, without any coating on a surface thereof. For example, the surface of the load roller 300 may be formed of a material different from that of the surface of the pressure roller 200.

Referring back to FIG. 1, the load roller 300 may provide a pressing force while being in contact with an upper portion of the pressure roller 200. For example, the load roller 300 may contact the pressure roller 200 to rotate as the first guide portion 122a and the second guide portion 122b are moved laterally, e.g., in the x-axis direction, so a position of contact of the load roller 300 with the pressure roller 200 may be varied. While in FIG. 1 the load roller 300 includes the first and second load rollers 310 and 320, embodiments are not limited thereto.

In detail, the first load roller 310 and the second load roller 320 may be supported by the first guide portion 122a and the second guide portion 122b, as described previously. As the first and second guide portions 122a and 122b move laterally along the support portion 121, the first load roller 310 and the second load roller 320 may contact the pressure roller 200, and thus, may simultaneously perform vertical movements and rotary motion. However, the vertical movements of the first and second load rollers 310 and 320 are not limited to being performed by the first and second guide portions 122a and 122b. For example, in an example embodiment, groove portions to which the central shaft C2 of the second load roller 310 and the central shaft C3 of the second load roller 320 are coupled may be formed in the first guide portion 122a and the guide portion 122b, respectively, e.g., grooves may be formed in the first and second guide portions 122a and 122b where the double-headed arrows are drawn in FIG. 1 (so the shafts C2 and C3 may move up and down in such grooves within the first and second guide portions 122a and 122b). The load roller 300 may be configured to simultaneously perform rotary movement and vertical movements via the groove portions, as will be described in more detail below with reference to FIGS. 3-4.

The first and second load rollers 310 and 320 may contact an upper portion of the pressure roller 200 in a longitudinal direction, to exert linear pressure on the upper portion of the pressure roller 200 in the longitudinal direction of the pressure roller 200. The first and second load rollers 310 and 320 may press the pressure roller 200, using pressing force exerted by a load of the load roller 300, rather than applying a pressing force through an artificial pressure member.

In general, to vary a pressing force of a pressure roller, a method of increasing or decreasing mass (i.e., pressing force) of the pressure roller may include replacing the pressure roller, e.g., replacing a pressure roller with a heavier pressure roller to increase the pressing force. However, since an imprinting process should be stopped to replace the pressure roller, a delay in the manufacturing process may occur. In addition, if the mass of the pressure roller is excessively increased to increase the pressing force of the pressure roller, deformation of the pressure roller may occur in a downward direction, thereby concentrating the pressing force of the pressure roller in a central region and causing a non-uniform pressing force. Further, while there may be a method in which an artificial pressure member is attached to a central shaft of a pressure roller or a surface of a pressure roller to provide a pressing force, it may be difficult to provide a uniform pressing force, since the pressing force may be concentrated in a region to which the pressure member is attached.

In contrast, according to example embodiments, since the pressure roller 200 is pressed by its own weight and that of the load roller 300, deformation due to an increase in mass of the pressure roller may be prevented, and a uniform pressing force may be provided. e.g., as compared with an attached artificial pressure member. In addition, since the pressing force of the pressure roller 200 may be varied by adjusting an angle formed by the load roller 300 and the pressure roller 200, as will be discussed with respect to FIGS. 3-4 below, there is no need to replace the pressure roller. Thus, a delay of the manufacturing process may be prevented.

Referring back to FIG. 2, the load roller 300, e.g., each of the first and second load rollers 310 and 320, and the pressure roller 200 may have the same length W1. Therefore, a uniform pressing force of the load roller 300 may be applied to a portion of thereof contacting the pressure roller 200. For example, when the load roller 300 includes the first and second load rollers 310 and 320, the first and second load rollers 310 and 320 may have the same length W1, such that the first and second load rollers 310 and 320 may provide uniform pressing force to the pressure roller 200 on both sides thereof, e.g., symmetrically.

As illustrated in FIG. 1, each of diameters D2 and D3 of the first and second load rollers 310 and 320 may be the same as a diameter D1 of the pressure roller 200, but is not limited thereto. For example, the first and second load rollers 310 and 320, and the pressure roller 200, may have different diameters. In another example, the first and second load rollers 310 and 320 may have diameters D2 and D3 the same as each other, respectively, but the diameters thereof are not limited thereto. In example embodiments, the first and second load rollers 310 and 320 may be configured to have different diameters.

Adjustment of the pressing force of the imprinting apparatus 1 will be described hereinafter with reference to FIGS. 3-4.

Referring to FIGS. 3 and 4, as the first and second guide portions 122a and 122b are laterally moved (illustrated by arrows in directions DR1 and DR2), the first and second load rollers 310 and 320 may contact a surface 201 of the pressure roller 200. For example, as the first and second guide portions 122a and 122b continue a lateral movement toward each other, the first and second load rollers 310 and 320 may continue simultaneous lateral and upward vertical movements, while contacting the surface 201 of the pressure roller 200. As such, the pressing force applied to the pressure roller 200 may vary in accordance with the angle between the pressure roller 200 and the first and second load rollers 310 and 320, as will be described in detail below.

In detail, when the first and second guide portions 122a and 122b are laterally moved in DR1 and DR2 directions by first and second load roller drivers 420 and 430, respectively, the first and second load rollers 310 and 320 may be subjected to vertical movements and rotary movement, while contacting the pressure roller 200, to move to an upper portion of the pressure roller 200. For example, while the first load roller 310 moves in the DR1 direction and rolls in the DR3 direction, while contacting the surface 201 of the pressure roller 200, the first load roller 310 may be pushed upward along the groove portion in the first guide portions 122a to a higher position relative to the pressure roller 200, thereby changing an angle between the first load roller 310 and the pressure roller 200. As such, the varying angle between the first load roller 310 and the pressure roller 200 changes the vertical component of the pressing force applied by the load roller 310 to the pressure roller 200, which in turn, changes a total pressing force applied by the load roller 310 and the pressure roller 200 on the imprint mold 600. Operation of the second load roller 320 is similar to that of the first load roller 310 and, therefore, will not be described separately.

In an example embodiment, surfaces 311 and 321 of the first and second load rollers 310 and 320 may be formed of stainless steel, and the surface 201 of the pressure roller 200 may be coated with rubber. Thus, the first and second load rollers 310 and 320 may move in DR3 and DR4 directions without sliding on the surface of the pressure roller 200. As described above, the first and second load rollers 310 and 320 may apply a pressing force exerted by a load, to the pressure roller 200, according to movements of the first and second guide portions 122a and 122b. Thus, the pressure roller 200 may provide a combined pressing force exerted by a load of the pressure roller 200 and loads of the first and second load rollers 310 and 320.

FIG. 4 is a view of a range in which the first and second load rollers 310 and 320 may move relative to the pressure roller 200. The first and second load rollers 310 and 320 may move between positions 310a and 320a thereof in contact with a side surface of the pressure roller 200 and positions 310b and 320b in which the first and second load rollers 310 and 320 meet each other, respectively. For example, positions 310a and 320a may refer to positions where the first and second load rollers 310 and 320 and the pressure roller 200 are all positioned on a same flat surface, while contacting each other. For example, positions 310b and 320b may refer to positions where the first and second load rollers 310 and 320 contact each other while contacting a top of the pressure roller 200. RG1 refers to a trace of a range in which the central shaft C2 of the first load roller 310 may move, and RG2 refers to a trace of a range in which the central shaft C3 of the second load roller 320 may move.

For example, when the first and second load rollers 310 and 320 are in contact with a side surface of the pressure roller 200 (i.e., positions 310a and 320a), the first and second load rollers 310 and 320 may not apply a pressing force to the pressure roller 200. When the first and second load rollers 310 and 320 contact each other (i.e., positions 310b and 320b), the first and second load rollers 310 and 320 and the pressure roller 200 may all be in contact with one another, such that the pressure roller 200 may not rotate, which will be described with reference to an included-angle formed by the central shaft C1 of the pressure roller 200, and the central shafts C2 and C3 of the first and second load rollers 310 and 320.

Angles, formed by a straight line O passing through the central shaft C1 of the pressure roller 200 along a normal direction to direction A and respective virtual straight lines L1 and L2, connecting the central shafts C2 and C3 of the first and second load rollers 310 and 320 to the central shaft C1 of the pressure roller 200, respectively, may be defined as first and second included-angles $\theta_1$, and $\theta_2$, respectively. The central shafts C2 and C3 of the first and second load rollers 310 and 320 may be moved within ranges of positions CL1 and CL2, in which the first and second load rollers 310 and 320 contact a side surface of the pressure roller 200, and positions CH1 and CH2, in which the first and second load rollers 310 and 320 contact each other, respectively. Thus, the central shafts C2 and C3 of the first and second load rollers 310 and 320 may move within a range in which the first and second included-angles $\theta_1$ and $\theta_2$ satisfy $\theta_1' < \theta_1 < 90°$ and $\theta_2' < \theta_2 < 90°$, respectively. The first and second guide portions 122a and 122b moving the first and second load rollers 310 and 320 may allow the central shafts C2 and C3 of the first and second load rollers 310 and 320 to be movable in the ranges of $\theta_1' < \theta_1 < 90°$ and $\theta_2' < \theta_2 < 90°$, respectively. W2 and W3 of FIG. 4 respectively refer to ranges in which the first and second load rollers 310 and 320 may apply a pressing force to the pressure roller 200 and the first and second guide portions 122a and 122b may move laterally within a range in which the pressure roller 200 may rotate.

Figure 5:
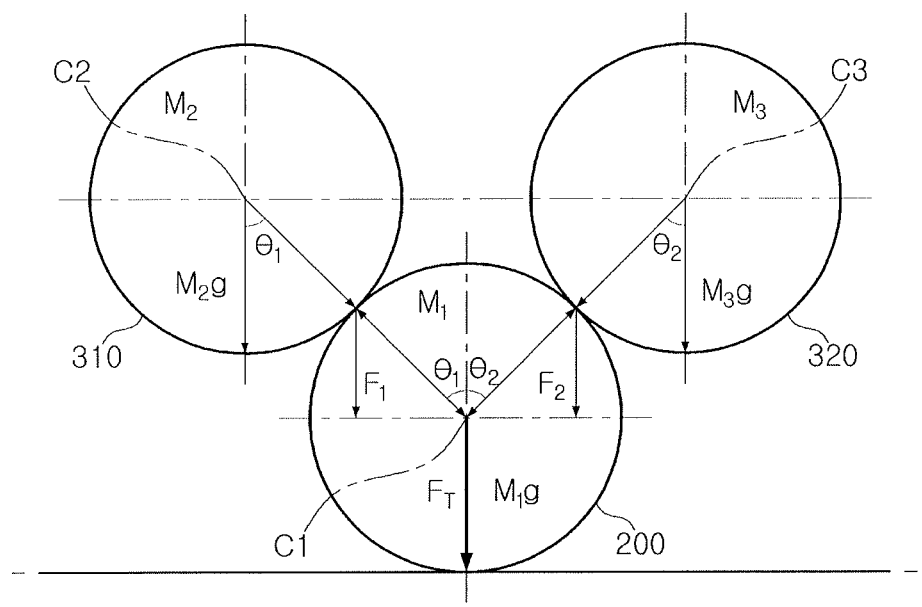
FIG. 5 illustrates a view of a pressing force of the imprinting apparatus of FIG. 1.

Next, with reference to FIG. 5, a magnitude of the pressing force applied to the pressure roller 200 depending on magnitudes of the first and second included-angles $\theta_1$ and $\theta_2$ will be described below.

A total amount of a pressing force $F_T$, applied by the pressure roller 200, may correspond to a resultant force of a pressing force exerted by a load of the pressure roller 200 and pressing forces $F_1$ and $F_2$ applied by loads of the first and second load rollers 310 and 320. Among the pressing forces, the pressing force exerted by the load of the pressure roller 200 may be represented by a product of mass $M_1$ of the pressure roller 200 and gravitational acceleration (g). The pressing forces F1 and F2 applied by the loads of the first and second load rollers 310 and 320 may be represented by products of masses $M_2$ and $M_3$ of the first and second load rollers 310 and 320, gravitational acceleration (g) and cosine values cos $\theta_1$ and cos $\theta_2$ of included-angles, respectively. Thus, the total pressing force $F_T$ may be represented by Equation 1 below.

$$F_T = M_1 g + M_2 g \cos \theta_1 + M_3 g \cos \theta_2 \qquad \text{Equation 1}$$

Thus, by adjusting the first and second included-angles $\theta_1$ and $\theta_2$ formed by the central shafts C2 and C3 of the first and second load rollers 310 and 320 and the central shaft C1 of the pressure roller 200, the total pressing force $F_T$ applied by the pressure roller 200 may be changed. Accordingly, by moving the first and second load rollers 310 and 320 along the pressure roller 200, the total pressing force applied to the imprint mold 600 by the combined pressing force of the first and second load rollers 310 and 320 and the pressure roller 200 may be easily adjusted, without replacing the imprinting apparatus to change the pressing force applied to an imprint mold in an imprinting process.

Figure 6:
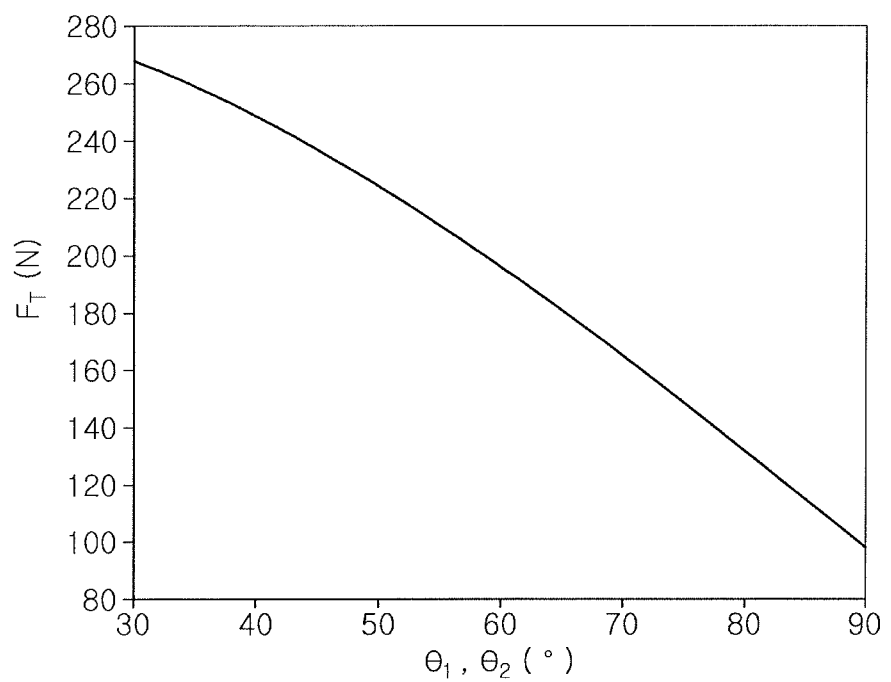
FIG. 6 illustrates a diagram of a correlation between an included angle between a load roller and a pressure roller, and a pressing force.

FIG. 6 illustrates that when a mass of the pressure roller 200 is 10 kg and masses of the first and second load rollers 310 and 320 are respectively 10 kg, as the first and second included-angles $\theta_1$ and $\theta_2$ are respectively changed from 30° to 90°, the total pressing force $F_T$ of the pressure roller 200 is changed. It can be appreciated that, as the included-angles $\theta_1$ and $\theta_2$ decrease, the entirety of the masses of the first and second load rollers 310 and 320 may be transferred to the pressure roller 200 as is, and thus, the total pressing force $F_T$ increases. In addition, it can be seen that the first and second included-angles $\theta_1$ and $\theta_2$, and the total pressing force $F_T$, have a linearly decreasing correlation therebetween.

For example, when correlation data obtained by digitizing such correlation is stored in the controller 500 and a user inputs a pressing force required for an imprinting process, the controller 500 may control the first and second load roller drivers 420 and 430, based on the stored correlation data. Thus, the first and second guide portions 122a and 122b connected to the first and second load roller drivers 420 and 430 may move to adjust the first and second included-angles $\theta_1$ and $\theta_2$ formed by the first and second load rollers 310 and 320 and the pressure roller 200 to provide the required pressing force the desired imprinting process.

With reference to FIG. 1, the driving unit 400 may include the pressure roller driver 410 moving the first frame 110 in the vertical direction, and the first and second load roller drivers 420 and 430 laterally moving the guide portions 122a and 122b of the first and second load rollers 310 and 320. The driving unit 400 may be disposed on the support portion 121 of the second frame 120. Operations of the driving unit 400 may be controlled by the controller 500. The driving unit 400 may be configured as a linear actuator, but is not limited thereto. For example, the driving unit 400 may be configured to be driven by a combination ball screw and stepping motor mechanism.

The controller 500 may control the driving unit 400 to control the first and second included-angles $\theta_1$ and $\theta_2$ formed by the first and second load rollers 310 and 320 and the pressure roller 200. The controller 500 may include, e.g., a central processing unit (CPU) configuring a body of the controller, a read only memory (ROM) in which data required for processing operations performed by the CPU is stored, a random access memory (RAM) including a memory region used for various data processing performed by CPU, and the like, and a data storage, e.g., a hard disk (HDD), a memory, or the like, in which various types of data or a program to control respective portions by the CPU are stored. In addition, the controller 500 may include an input device inputting data to the controller 500 by a user.

The controller 500 may store or read the above-described correlation data in or from the data storage, based on a predetermined program read from the data storage. In addition, for example, when a user inputs pressing force required for an imprinting process through the input device, the driving unit 400 may be controlled, based on the correlation data stored in the data storage, thereby adjusting the first and second included-angles $\theta_1$ and $\theta_2$ formed by the first and second load rollers 310 and 320 and the pressure roller 200.

Figure 7:
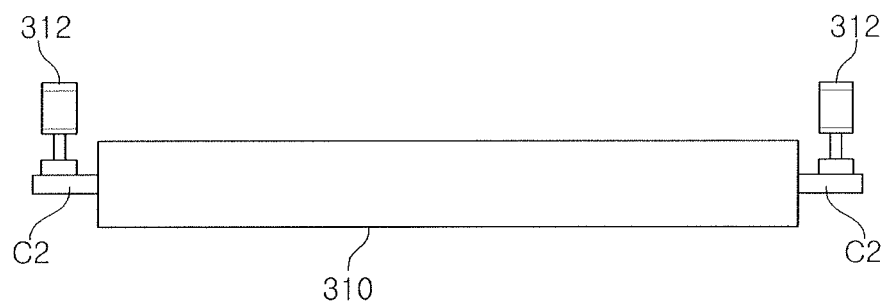
FIG. 7 illustrates an example in which a pressure cylinder is added to a load roller.

In a modified example, as illustrated in FIG. 7, an additional pressure member 312, e.g., a pressurizing cylinder, may also be attached to the central shaft C2 of the load roller 310, to increase a pressing force exerted by the load roller 310. Although FIG. 7 illustrates a case in which the additional pressure member 312 is attached to the first load roller 310, the present disclosure is not limited thereto. The additional pressure member 312 may also respectively be installed on the first and second pressure rollers 310 and 320. For example, when the pressure member 312 is attached to the central shaft C2 of the load roller 310, since the pressing force of the pressure member 312 may be applied to the pressure roller 200 via the load roller 310, imbalance of the pressing force may be reduced as compared with a case in which a pressure member is attached directly to a pressure roller.

Figure 8:
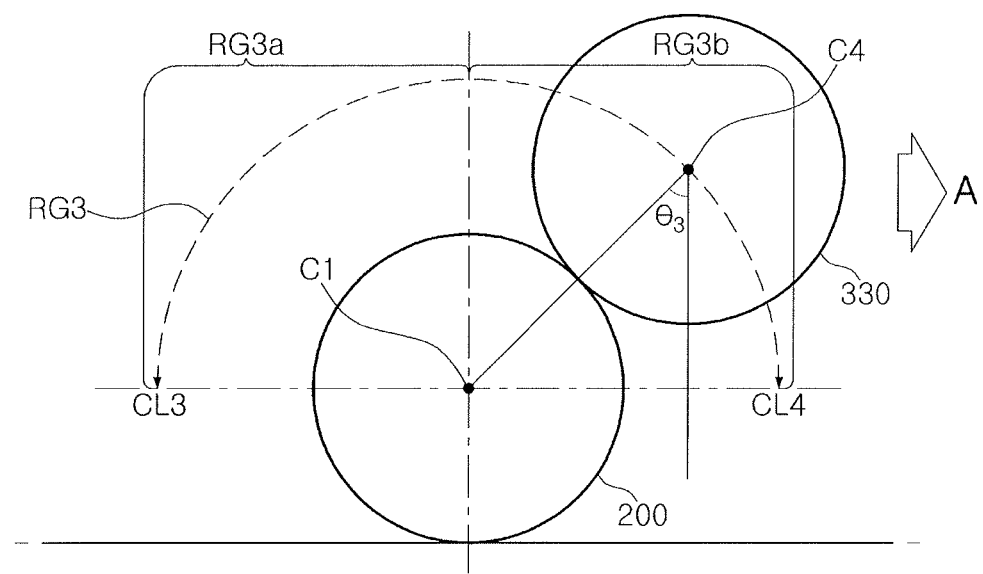
FIG. 8 illustrates a modified example of the imprinting apparatus of FIG. 1.

In another modified example, as illustrated in FIG. 8, the load roller is provided as a single load roller. Configurations other than the load roller are similar to those of the imprinting apparatus 1 described above with reference to FIG. 1, and thus, only movement of the load roller in contact with an upper portion of the pressure roller will be described below.

Referring to FIG. 8, a structure in which one load roller 330 presses the pressure roller 200 may be employed. Thus, in this case, since the load roller 330 may move within a range of CL3 to CL4 before a central shaft C4 of the load roller 330 becomes horizontal with respect to a central shaft C1 of the pressure roller 200, the movement range of the one load roller 330 may be extended, e.g., as compared with the embodiment of FIG. 1. For example, when included-angles $\theta_3$ of the load roller 330 and the pressure roller 200 are the same as each other, even when the central shaft C4 of the load roller 330 is disposed in either of a forward range RG3$a$ and a rearward range RG3$b$ with respect to the single direction A, the same degree of pressing force may be applied. Thus, the arrangement of the load roller 330 may be appropriately changed depending on locations of installation.

In FIG. 8, the number of load rollers is reduced, as compared to that of the embodiment of FIG. 1. Although the amount of pressing force applied to the pressure roller 200 may be reduced in FIG. 8 as compared to that in FIG. 1 (due to the reduced number of load rollers), manufacturing costs may be reduced, as compared with those of FIG. 1. Further, as the number of the load roller 330 is reduced, a space occupied by the imprinting apparatus may be reduced.

By way of summation and review, as display devices are diversified, there is a need to diversify the pressing force applied to a stamp in a nanoimprint lithography method in accordance with the size of the display device to be manufactured. However, there has been a problem in such a case, in that an imprinting apparatus should be replaced to change the pressing force of an imprinting process.

In contrast, according to an aspect of the present disclosure, an imprinting apparatus capable of varying the pressing force without replacing a pressure roller is provided. That is, as set forth above, an imprinting apparatus according to an example embodiment may employ a load roller capable of, e.g., continuously, varying an angle of contact with a pressure roller, to vary a pressing force and to provide a uniform pressure force according to the size of an object and the characteristics of the imprint material, without replacing the pressure roller. Thus, the time required for a change in pressing force of an imprinting apparatus may be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An imprinting apparatus, comprising:
    a first frame above an imprint mold, the first frame being movable in a single direction along the imprint mold;
    a pressure roller rotatably supported on a first end of the first frame;
    a second frame including:
        a support portion coupled to a second end of the first frame, and
        at least one guide portion coupled to the support portion to be laterally movable;
    at least one load roller supported by the at least one guide portion, the at least one load roller being movable in a vertical direction while being rotatable and contacting a surface of the pressure roller on an upper portion of the pressure roller according to a lateral movement of the at least one guide portion, the at least one load roller to press the pressure roller by force exerted by a load of the at least one load roller; and
    a driving unit on the support portion to laterally move the at least one guide portion in the single direction, the at least one guide portion being moveable independently of the first frame to vary a distance between the at least one guide portion and the first frame.

2. The imprinting apparatus as claimed in claim 1, wherein the pressure roller and the at least one load roller are arranged in parallel to each other in a direction perpendicular to the single direction, the pressure roller and the at least one load roller having a same length in the direction perpendicular to the single direction.

3. The imprinting apparatus as claimed in claim 1, wherein the at least one load roller includes a first load roller and a second load roller, the first load roller and the second load roller being arranged in parallel to each other in a direction perpendicular to the single direction.

4. The imprinting apparatus as claimed in claim 3, wherein the pressure roller is between the first load roller and the second load roller, the pressure roller being in contact with the first load roller and the second load roller in a longitudinal direction.

5. The imprinting apparatus as claimed in claim 3, wherein the first load roller and the second load roller have a same diameter and a same mass.

6. The imprinting apparatus as claimed in claim 3, wherein:
    the at least one guide portion includes a first guide portion and a second guide portion coupled to the first load roller and the second load roller, respectively, and
    the first and second guide portions are separated and spaced apart from each other, the first and second guide portions being moveable laterally toward each other along the support portion.

7. The imprinting apparatus as claimed in claim 6, wherein:
    each of the first guide portion and the second guide portion includes a groove along the vertical direction, and
    the first load roller and the second load roller are moveable in the vertical direction along a respective groove while maintaining contact with the pressure roller.

8. The imprinting apparatus as claimed in claim 7, wherein the first guide portion and the second guide portion are at opposite ends of the first frame in the single direction.

9. The imprinting apparatus as claimed in claim 1, wherein the first frame is vertically movable in a direction perpendicular to the single direction.

10. The imprinting apparatus as claimed in claim 1, wherein a surface of the pressure roller includes a material different from a material of a surface of the at least one load roller.

11. The imprinting apparatus as claimed in claim 1, further comprising a pressure member coupled to a central shaft of the at least one load roller.

12. An imprinting apparatus, comprising:
a first frame above an imprint mold, the first frame being moveable in a single direction along the imprint mold;
a pressure roller rotatably supported on the first frame to press the imprint mold as the first frame moves;
a second frame coupled to the first frame, the second frame being laterally movable; and
at least one load roller rotatably supported by the second frame, while contacting the pressure roller on an upper portion of the pressure roller to press the pressure roller by force exerted by a load of the at least one load roller, the at least one load roller having a central shaft deviating from a central shaft of the pressure roller in a vertical direction perpendicular to the single direction, and moving in the vertical direction while being in contact with a surface of the pressure roller according to a lateral movement of the second frame,
wherein the second frame includes a support portion coupled to the first frame, and at least one guide portion coupled to the support portion, the at least one guide portion being laterally movable in the single direction along the support portion independently of the first frame.

13. The imprinting apparatus as claimed in claim 12, wherein the at least one load roller is rotatably coupled to one end of the at least one guide portion.

14. An imprinting apparatus, comprising:
a first frame above an imprint mold, the first frame being moveable in a single direction along the imprint mold;
a pressure roller rotatably supported on the first frame to press the imprint mold as the first frame moves;
a second frame including a support portion coupled to the first frame, and at least one guide portion coupled to the support portion, the at least one guide portion being laterally movable toward the first frame in the single direction on the support portion;
a driving unit on the support portion, to laterally move the at least one guide portion in the single direction;
a controller to control the driving unit; and
at least one load roller rotatably supported on the at least one guide portion while contacting the pressure roller on an upper portion of the pressure roller to press the pressure roller by force exerted by a load of the at least one load roller, the at least one load roller changing a pressing force applied to the imprint mold by the pressure roller, while moving along a surface of the pressure roller as the at least one guide portion is moved laterally in response to a driving signal of the controller.

15. The imprinting apparatus as claimed in claim 14, wherein the controller further includes a data storage to store data of correlation between an included angle, formed by a first virtual straight line in a direction perpendicular to the single direction and by a second virtual straight line connecting a central shaft of the at least one load roller to a central shaft of the pressure roller, and a pressing force formed as the pressure roller pressed by the at least one load roller presses the imprint mold, and determines the included angle corresponding to the pressing force to be applied to the imprint mold, with reference to the data of correlation.

16. The imprinting apparatus as claimed in claim 14, wherein the pressure roller and the at least one load roller are arranged in parallel to each other in a direction perpendicular to the single direction.

17. The imprinting apparatus as claimed in claim 16, wherein the at least one load roller includes a first load roller and a second load roller, the first and second load rollers have a same diameter, and included angles of the first and second load rollers are identical to each other.

* * * * *